Figure 1:
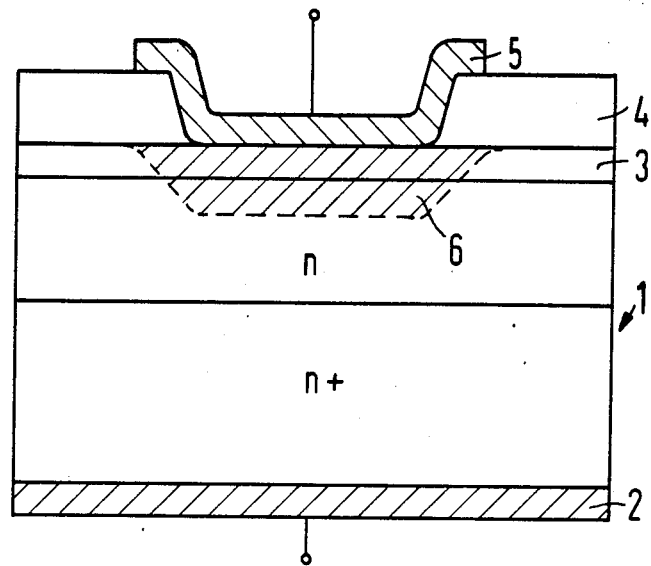

United States Patent [19]

Mitlehner et al.

[11] Patent Number: 4,680,601
[45] Date of Patent: Jul. 14, 1987

[54] SCHOTTKY POWER DIODE

[75] Inventors: Heinz Mitlehner; Bernd Kolbesen, both of Munich, Fed. Rep. of Germany

[73] Assignee: Siemens Aktiengesellschaft, Berlin and Munich, Fed. Rep. of Germany

[21] Appl. No.: 885,814

[22] Filed: Jul. 15, 1986

Related U.S. Application Data

[63] Continuation of Ser. No. 494,697, May 16, 1983, abandoned.

[30] Foreign Application Priority Data

May 25, 1982 [DE] Fed. Rep. of Germany ....... 3219606

[51] Int. Cl.⁴ ............................................ H01L 29/86
[52] U.S. Cl. ........................................ 357/15; 357/2; 357/16; 357/52; 357/54; 357/53; 357/59
[58] Field of Search ................. 357/15, 2, 4, 16, 59 R, 357/52, 54, 53

[56] References Cited

U.S. PATENT DOCUMENTS

| | | | |
|---|---|---|---|
| 4,064,521 | 12/1977 | Carlson | 357/15 |
| 4,142,195 | 2/1979 | Carlson et al. | 357/15 |
| 4,196,438 | 4/1980 | Carlson | 357/15 |
| 4,485,389 | 11/1984 | Ovishinsky et al. | 357/15 |

FOREIGN PATENT DOCUMENTS 55-19061  5/1980  Japan ..................... 357/15

OTHER PUBLICATIONS

Oleszek, *IBM Tech. Discl. Bulletin*, vol. 17, No. 2, Jul. 1974, p. 468.
Le Comber et al, *Proceedings of the Fifth International Conf. on Amorphous and Liquid Semiconductors*, Sep. 3-8, 1978, pp. 245-250.
Morel et al, *Appl. Phys. Lett.*, 39(8), Oct. 15, 1981, (AIP), pp. 612-614.
Spear, *Proceedings of the Fifth International Conf. on Amorphous and Liquid Semiconductors*, Sep. 3-8, 1978, pp. 1-16.
Fuhs et al, *AIP Conf. Proceedings*, No. 20, Mar. 20-22, 1974, pp. 345-350.
Waggit, *Electronic Engineering*, Aug. 1978, pp. 42-43.
Hampshire et al, *J. Phys. D: Appl. Phys.*, vol. 10, No. 18, (Dec. 21, 1977), pp. 2491-2501.
"Electronics", Feb. 5, 1976, vol. 49, No. 3, pp. 85 to 89, by Cooper, Bixby and Carver, title: Power Schottky Diodes-a Smart Choice for Fast Rectifiers.

*Primary Examiner*—William D. Larkins
*Attorney, Agent, or Firm*—John Francis Moran

[57] ABSTRACT

A Schottky power diode includes a semiconductor substrate having a given band gap, a semi-insulating intermediate layer disposed on the substrate, an insulating layer disposed on the intermediate layer and a Schottky contact disposed on the intermediate layer, whereby the intermediate layer is disposed between the Schottky contact and the substrate, the intermediate layer having a density of localized states from $10^{17}$ to $10^{20}$ eV cm$^{-3}$, the intermediate layer having a band gap larger than the given band gap in the semiconductor substrate, and the intermediate layer having a resistivity of between $10^5$ and $10^{11}$ ohm cm. On the other hand the insulating layer may be disposed on the substrate and the intermediate layer may be at least partly disposed on the insulating layer.

6 Claims, 2 Drawing Figures 4,680,601

SCHOTTKY POWER DIODE

CROSS-REFERENCE

This is a continuation of Ser. No. 494,697 filed May 16, 1983 now abandoned.

The invention relates to a Schottky power diode with a semiconductor substrate, an insulating layer on the substrate, and a Schottky contact.

Such a Schottky power diode, as has been described in the journal "Electronics", Feb. 5, 1976, pages 85 to 89, has the advantage of having a lower forward resistance than that of pn-diodes. Since Schottky power diodes have a conduction mechanism which is of a unipolar nature, contrary to pn-conduction diodes, its cutoff delay times are very small so that a Schottky power diode can be operated at high frequencies in the range of, for instance, 100 kHz and above. However, it is a disadvantage of such a device that the relatively low maximum reverse voltage is in the order of 50 to 100 V.

It is accordingly an object of the invention to provide a Schottky power diode which overcomes the hereinafter-mentioned disadvantages of the heretofore-known devices of this general type, and to do so in such a manner that the reverse voltage can be increased to above 100 V. At the same time, the cutoff current losses are to be minimized and an operating temperature of up to about 180° C. should be permissible. In addition, the voltage drop in the forward operation should remain smaller than that of a comparable pn-diode and the cutoff delay time should be in the nano second range.

With the foregoing and other objects in view there is provided, in accordance with the invention a Schottky power diode, comprising a semiconductor substrate having a given band gap, a semiinsulating intermediate layer disposed on the substrate, an insulating layer disposed on the intermediate layer and a Schottky contact disposed on the intermediate layer, where the intermediate layer is disposed between the Schottky contact and the substrate, the intermediate layer having a density of localized states from $10^{17}$ to $10^{20}$ eVcm$^{-3}$, the intermediate layer having a band gap larger than the given band gap in the semiconductor substrate, and the intermediate layer having a resistivity of between $10^5$ and $10^{11}$ ohm cm. On the other hand the insulating layer may be deposited on the substrate and the intermediate layer may be at least partly disposed on the insulating layer.

In accordance with another feature of the invention, the intermediate layer is formed of amorphous silicon and the substrate is formed of monocrystalline silicon.

In accordance with an additional feature of the invention, the intermediate layer is formed of amorphous germanium and the substrate is formed of monocrystalline silicon.

In accordance with a further feature of the invention the intermediate layer is between 10 and 50 nm thick.

In accordance with again another feature of the invention the amorphous silicon layer is formed of vapor-deposited silicon containing between 2 and 40 atom percent oxygen.

In accordance with still a further feature of the invention the amorphous silicon layer is a glow-discharge deposited layer and contains between 5 and 20 atom percent hydrogen.

In accordance with again an additional feature of the invention the intermediate layer is entirely disposed on the substrate, and the Schottky contact makes contact with the intermediate layer through a window formed in the insulating layer.

In accordance with a further feature of the invention the intermediate layer is partly disposed on the insulating layer and partly disposed on the substrate in a window formed in the insulating layer.

In accordance with again another feature of the invention the Schottky contact extends beyond the edge of the window formed in the insulating layer.

In accordance with a concomitant feature of the invention the Schottky contact extends beyond the edge of the window formed in the insulating layer on to the insulating layer or intermediate layer depending on whether the intermediate or insulating layer in on top.

Other features which are considered as characteristic for the invention are set forth in the appended claims.

Although the invention is illustrated and described herein as embodied in a Schottky power diode, it is nevertheless not intended to be limited to the details shown, since various modifications and structural changes may be made therein without departing from the spirit of the invention and within the scope and range of equivalents of the claims.

Figure 2:
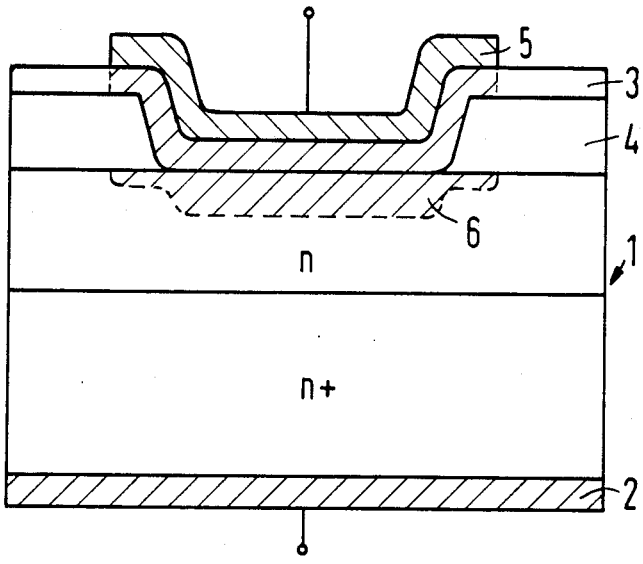

The construction and method of operation of the invention, however, together with additional objects and advantages thereof will be best understood from the following description of specific embodiments when read in connection with the accompanying drawings, in which:

FIG. 1 is a diagrammatic cross-section view of a first embodiment of the Schottky power diode of the invention; and FIG. 2 is a view similar to FIG. 1 of a second embodiment of the invention.

Referring to the figures of the drawing in detail and first particularly to FIG. 1 thereof, it is seen that the Schottky power diode shown in FIG. 1 has a substrate 1 which is formed of two layers of monocrystalline silicon that are n-doped to different degrees. The substrate is connected to an ohmic cathode contact 2. An intermediate layer 3 with a thickness of 10 to 50 nm is disposed on the entire surface of the more weakly doped layer of the substrate 1. The intermediate layer 3 is formed of a material with a density of localized states of $10^{17}$ and $10^{20}$ eV cm$^{-3}$ in the forbidden band. This material must furthermore have a greater band or energy gap than the semiconductor substrate and a resistivity between $10^5$ and $10^{11}$ ohm cm.

The Fermi level of the material is at least approximately in the center of the band. Due to its resistance, the material can be referred to as a semiinsulating material. Amorphous silicon is preferably considered for use as the intermediate layer 3. However, other substances with the above-described properties, such as amorphous germanium, may also be used. The intermediate layer 3 is covered with an insulating layer 4 which is formed for instance, of silicon dioxide SiO$_2$. A window is formed in the insulating layer 4, in which a Schottky contact 5 is disposed. This Schottky contact makes contact with the intermediate layer 3.

In FIG. 2, a Schottky power diode is shown in which the intermediate layer 3 is disposed outside the window and over the insulating layer 4. The intermediate layer 3 lies on the substrate 1 within the window.

In both embodiments, the Schottky contact 5 is drawn out beyond the edge of the window. This is not mandatory but it has advantageous effects on the curvature of the space charge zone in the substrate.

When an inverse or blocking voltage is applied, a space charge zone 6 is produced; the zone 6 is shaded in the drawings and the boundary thereof is shown in broken lines. This space charge zone is built-up in the intermediate layer 3 at the localized states and extends into the substrate. In the intermediate layer, part of the inverse or reverse voltage is broken down, so that the substrate doping can be increased accordingly.

Higher inverse or reverse voltages can be obtained with the same doping. The above-mentioned properties of the intermediate layer lead to an increase and widening of the potential barrier. Leakage currents due to tunnelling can therefore be better suppressed by the barrier. The effective barrier increase is aided by the so-called hetero-junction between the substrate 1 and the intermediate layer 3. The band gap of 1.6 eV in amorphous silicon, for instance, is distinctly larger than that of crystalline silicon at 1.1 eV. The influence of the boundary surface states in the monocrystalline substrate on the cutoff current behavior of the Schottky diode is effectively suppressed by the localized states or conditions in the intermediate layer in front of the metal contact. The cutoff characteristic therefore becomes flatter and goes steeply into an avalanche breakdown.

In the embodiment according to FIG. 1, the semi-insulating intermediate layer 3 has a further advantage which is that it acts as a passivation of the critical edge regions at the end of the space charge zone 6, which is shaded in the drawing. Instabilities due to changing space charge zone curvature are prevented.

With forward voltage applied, the current is controlled by drift and diffusion and is not carried as a recombination current. The quality factor of the diode is therefore close to 1. The determining factor for this behavior is the thin intermediate layer ($<<1$ μm) and the high state density in this layer. This means that in forward operation, the states distributed over the forbidden band are flooded with charge carriers, so that the forward resistance becomes small. A high potential barrier makes this forward behavior worse. However, the forward voltage drop remains, in any case, below that of bipolar pn-diodes. Due to the high state density in the intermediate layer 3, the service life of the charge carriers is very short. Tests have shown that such a diode keeps its blocking ability at a frequency of 1 MHz. The intermediate layer 3 can be applied, for instance, by vapor deposition or by a glow discharge. The resistivity of vapor-deposited amorphous silicon can be controlled by an oxygen content of 2 to 40 atom percent within the indicated wide limits of $10^5$ to $10^{11}$ ohm cm. The oxygen content can be set in this case by a suitably adjusted partial oxygen pressure in the deposition vessel.

If the amorphous silicon is deposited by a glow discharge, the resistivity can be adjusted within the indicated wide limits by the choice of a deposition temperature between 150° and 350° C. and the addition of 5 to 20 atom percent hydrogen. In this case, the hydrogen content is set by the glow discharge power, the gas pressure and the substrate temperature. The range between 10 nm and 50 nm is to be considered as the layer thickness for the intermediate layer 3.

A typical Schottky power diode for an inverse or reverse voltage of above 100 V has, for instance, a substrate with a resistivity of 20 ohm cm, a thickness of the lower-doped layer of 50 μm and a resistivity of from $10^7$ to $10^8$ ohm cm for the intermediate layer 3. In this case, the thickness of the intermediate layer is 30 nm.

The customary metals such as molybdenum, tungsten, platinum, as well as aluminum and chromium, can be considered for the Schottky contact layer 5.

There has thus been shown and described a novel Schottky power diode which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A Schottky power diode comprising: a semiconductor substrate haing a given band gap, said semiconductor substrate comprising monocrystalline silicon material, an insulating layer disposed on said substrate, a semi-insulating intermediate layer at least partly disposed on said insulating layer, and a Schottky contact disposed on said intermediate layer, said intermediate layer being disposed between said Schottky contact and said substrate, said intermediate layer having a density of localized states from $10^{17}$ to $10^{20}$ eV cm$^{-3}$, said intermediate layer having a band gap larger than said given band gap in said semiconductor substrate, said intermediate layer having a resistivity of between $10^5$ and $10^{11}$ ohm cm, said intermediate layer being partly disposed on said insulating layer and being partly disposed on said substrate in a window formed in said insulating layer and said Schottky contact extending beyond the edge of said window formed in said insulating layer on to said intermediate layer.

2. A Schottky power diode according to claim 1, wherein said intermediate layer is formed of amorphous silicon.

3. A Schottky power diode according to claim 1, wherein said intermediate layer is formed of amorphous germanium.

4. A Schottky power diode according to claim 1, wherein said intermediate layer is between 10 and 50 nm thick.

5. A Schottky power diode according to claim 2, wherein said amorphous silicon layer is formed of vapor-deposited silicon containing between 2 and 40 atom percent oxygen.

6. A Schottky power diode according to claim 2, wherein said amorphous silicon layer is a glow discharge-deposited layer and contains between 5 and 20 atom percent hydrogen.

* * * * *